(12) United States Patent
Deliwala et al.

(10) Patent No.: US 9,590,129 B2
(45) Date of Patent: Mar. 7, 2017

(54) OPTICAL SENSOR MODULE

(71) Applicant: ANALOG DEVICES GLOBAL, Hamilton (BM)

(72) Inventors: Shrenik Deliwala, Andover, MA (US); Ying Zhao, Andover, MA (US); Seokphyo Chun, Yongin (KR)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/945,255

(22) Filed: Nov. 18, 2015

(65) Prior Publication Data

US 2016/0141440 A1    May 19, 2016

Related U.S. Application Data

(60) Provisional application No. 62/082,023, filed on Nov. 19, 2014.

(51) Int. Cl.
*H01L 31/12* (2006.01)
*H01L 31/18* (2006.01)

(52) U.S. Cl.
CPC .............. *H01L 31/12* (2013.01); *H01L 31/18* (2013.01)

(58) Field of Classification Search
None
See application file for complete search history.

(56) References Cited

U.S. PATENT DOCUMENTS

| | | |
|---|---|---|
| 5,247,597 A | 9/1993 | Blacha et al. |
| 5,289,002 A | 2/1994 | Tarn |
| 5,340,420 A | 8/1994 | Ozimek et al. |
| 5,421,928 A | 6/1995 | Knecht et al. |
| 5,500,505 A | 3/1996 | Jones |
| 5,643,472 A | 7/1997 | Engelsberg et al. |
| 6,113,835 A | 9/2000 | Kato et al. |

(Continued)

FOREIGN PATENT DOCUMENTS

| | | |
|---|---|---|
| DE | 19909242 A1 | 8/2000 |
| EP | 1 276 142 A2 | 1/2003 |

(Continued)

OTHER PUBLICATIONS

Office Action mailed Jun. 17, 2014 in U.S. Appl. No. 13/560,855, filed Jul. 27, 2012 in 11 pages.

(Continued)

*Primary Examiner* — Alexander Ghyka
(74) *Attorney, Agent, or Firm* — Knobbe, Martens, Olson & Bear, LLP

(57) ABSTRACT

An optical sensor module is disclosed. The optical sensor module can include a housing comprising an air cavity. An optical emitter die can be disposed in the air cavity of the housing. A top surface of the optical emitter die can face a first side of the housing, the optical emitter die configured to emit light towards the first side of the housing. An optical sensor die can be disposed in the air cavity of the housing adjacent the optical emitter die. The optical sensor die can be spaced from the optical emitter die by a lateral distance. A top surface of the optical sensor die can face the first side of the housing. There may be no septum between the optical sensor die and the optical emitter die that optically separates the optical sensor die and the optical emitter die.

18 Claims, 5 Drawing Sheets

(56) References Cited

U.S. PATENT DOCUMENTS

| | | | |
|---|---|---|---|
| 6,335,224 B1 | 1/2002 | Peterson et al. | |
| 6,344,664 B1 | 2/2002 | Trezza et al. | |
| 6,352,880 B1 | 3/2002 | Takai et al. | |
| 6,379,988 B1 | 4/2002 | Peterson et al. | |
| 6,396,116 B1 | 5/2002 | Kelly et al. | |
| 6,531,328 B1 | 3/2003 | Chen | |
| 6,576,867 B1 | 6/2003 | Lu et al. | |
| 6,602,430 B1 | 8/2003 | Nally et al. | |
| 6,707,161 B2 | 3/2004 | Moon et al. | |
| 6,787,916 B2 | 9/2004 | Halahan | |
| 6,825,065 B2 | 11/2004 | Moon et al. | |
| 6,861,641 B1 | 3/2005 | Adams | |
| 6,864,460 B2 | 3/2005 | Cummings et al. | |
| 6,878,564 B2 | 4/2005 | Silverbrook | |
| 6,878,900 B2 | 4/2005 | Corkum et al. | |
| 6,915,049 B2 | 7/2005 | Murata | |
| 6,930,398 B1 | 8/2005 | Sun et al. | |
| 7,049,639 B2 | 5/2006 | Wang et al. | |
| 7,209,362 B2 | 4/2007 | Bando | |
| 7,279,343 B1 | 10/2007 | Weaver et al. | |
| 7,294,827 B2 | 11/2007 | Tan et al. | |
| 7,335,922 B2 | 2/2008 | Plaine et al. | |
| 7,348,203 B2 | 3/2008 | Kaushal et al. | |
| 7,405,487 B2 | 7/2008 | Brand | |
| 7,442,559 B2 | 10/2008 | Auburger et al. | |
| 7,485,848 B2 | 2/2009 | Minamio | |
| 7,720,337 B2 | 5/2010 | Lu et al. | |
| 7,723,146 B2 | 5/2010 | Chow et al. | |
| 7,755,030 B2 | 7/2010 | Minamio | |
| 7,777,172 B2 | 8/2010 | Hernoult | |
| 7,786,186 B2 | 8/2010 | Patterson | |
| 7,807,505 B2 | 10/2010 | Farnworth et al. | |
| 7,838,899 B2 | 11/2010 | Chow et al. | |
| 8,033,446 B2 | 10/2011 | Wada et al. | |
| 8,378,502 B2 | 2/2013 | Chow et al. | |
| 8,399,994 B2 | 3/2013 | Roh et al. | |
| 8,466,902 B2 | 6/2013 | Boer et al. | |
| 8,531,018 B2 | 9/2013 | Pahl | |
| 8,538,215 B2 | 9/2013 | Deliwala et al. | |
| 8,601,677 B2 | 12/2013 | Doany et al. | |
| 8,766,186 B2 | 7/2014 | Kierse et al. | |
| 8,779,361 B2 * | 7/2014 | Costello | G01D 5/34715 250/216 |
| 8,822,925 B1 | 9/2014 | Patel et al. | |
| 8,975,108 B2 * | 3/2015 | Rudmann | H01L 31/12 257/98 |
| 2002/0021874 A1 | 2/2002 | Giboney et al. | |
| 2002/0181882 A1 | 12/2002 | Hibbs-Brenner et al. | |
| 2003/0197292 A1 | 10/2003 | Huang | |
| 2003/0219217 A1 | 11/2003 | Wickman et al. | |
| 2004/0037507 A1 | 2/2004 | Marion et al. | |
| 2005/0087522 A1 | 4/2005 | Sun et al. | |
| 2005/0135071 A1 | 6/2005 | Wang et al. | |
| 2005/0226569 A1 | 10/2005 | Sashinaka et al. | |
| 2006/0001116 A1 | 1/2006 | Auburger et al. | |
| 2006/0027479 A1 | 2/2006 | Auburger et al. | |
| 2006/0045421 A1 | 3/2006 | Baets et al. | |
| 2006/0049548 A1 | 3/2006 | Auburger et al. | |
| 2006/0126331 A1 | 6/2006 | Chien | |
| 2007/0222041 A1 | 9/2007 | Weng et al. | |
| 2007/0284549 A1 * | 12/2007 | Mizuo | G06K 7/10702 250/555 |
| 2007/0291490 A1 | 12/2007 | Tajul et al. | |
| 2008/0079019 A1 | 4/2008 | Huang et al. | |
| 2008/0157252 A1 | 7/2008 | Cheng et al. | |
| 2009/0011522 A1 | 1/2009 | Drennan et al. | |
| 2009/0014857 A1 | 1/2009 | Hufgard | |
| 2009/0046144 A1 | 2/2009 | Tuttle | |
| 2009/0070727 A1 | 3/2009 | Solomon | |
| 2009/0134481 A1 | 5/2009 | Sengupta | |
| 2009/0189177 A1 | 7/2009 | Lee et al. | |
| 2009/0213262 A1 | 8/2009 | Singh et al. | |
| 2009/0218588 A1 | 9/2009 | Panaccione et al. | |
| 2009/0226130 A1 | 9/2009 | Doany et al. | |
| 2009/0269006 A1 | 10/2009 | Ishikawa et al. | |
| 2010/0019393 A1 | 1/2010 | Hsieh et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2010/0259766 A1 | 10/2010 | Wiese et al. | |
| 2010/0327164 A1 * | 12/2010 | Costello | G01D 5/34715 250/338.1 |
| 2011/0024899 A1 | 2/2011 | Masumoto et al. | |
| 2011/0062572 A1 | 3/2011 | Steijer et al. | |
| 2011/0176765 A1 | 7/2011 | Lee | |
| 2011/0204233 A1 | 8/2011 | Costello et al. | |
| 2011/0254763 A1 | 10/2011 | Lee et al. | |
| 2012/0027234 A1 | 2/2012 | Goida | |
| 2012/0287443 A1 | 11/2012 | Lin et al. | |
| 2012/0313204 A1 * | 12/2012 | Haddad | H01L 27/1462 257/432 |
| 2013/0082951 A1 | 4/2013 | Tanaka et al. | |
| 2013/0147727 A1 | 6/2013 | Lee et al. | |
| 2013/0230273 A1 | 9/2013 | Doscher et al. | |
| 2013/0285185 A1 | 10/2013 | Park et al. | |
| 2013/0292706 A1 | 11/2013 | Costello et al. | |
| 2013/0292786 A1 | 11/2013 | Sengupta | |
| 2013/0327931 A1 * | 12/2013 | Hsu | G01V 8/12 250/237 R |
| 2014/0027867 A1 | 1/2014 | Goida et al. | |
| 2014/0340302 A1 * | 11/2014 | Sengupta | G06F 3/042 345/156 |
| 2015/0270305 A1 * | 9/2015 | Hayashi | H01L 27/14623 257/432 |
| 2015/0378013 A1 * | 12/2015 | Bikumandla | G01S 17/026 250/201.1 |
| 2016/0013223 A1 * | 1/2016 | Chang | G01S 7/499 257/432 |
| 2016/0276503 A1 * | 9/2016 | Kasano | H01L 31/02327 |

FOREIGN PATENT DOCUMENTS

| | | |
|---|---|---|
| WO | WO 01/68460 A2 | 9/2001 |
| WO | WO 2007/005636 A2 | 1/2007 |

OTHER PUBLICATIONS

Office Action mailed Sep. 3, 2014 in U.S. Appl. No. 13/462,604, filed May 2, 2012 in 15 pages.

Office Action mailed Jun. 19, 2015 in U.S. Appl. No. 13/462,604, filed May 2, 2012 in 15 pages.

Office Action mailed Aug. 8, 2016 in U.S. Appl. No. 14/276,238 filed May 13, 2014, in 27 pages.

* cited by examiner

OPTICAL SENSOR MODULE

CROSS-REFERENCE TO RELATED APPLICATIONS

This application claims priority to U.S. Provisional Patent Application No. 62/082,023, filed on Nov. 19, 2014, the entire contents of which are incorporated by reference herein in their entirety and for all purposes.

BACKGROUND

Field

This invention relates to optical sensor modules, and packaging therefor.

Description of the Related Art

Optical sensor modules are used in a variety of optical sensing applications. For example, gesture sensors may be used to detect movement of an object, such as a user's hand. Such detection can be processed, for example, allowing a user to provide input to an electronic device by making certain gestures. Gesture sensors can be used in a wide variety of fields such as consumer electronics, healthcare, or telecommunications. In addition, optical sensor modules may be used in various types of medical devices, such as heart rate monitors, oxygen sensors, etc. Components for such optical sensor modules can include an optical emitter, an optical sensor die, and an associated application-specific integrated circuit (ASIC). The ASIC may be configured to process the output signal from the optical sensor die.

With increasing emphasis on miniaturization, it is desirable to arrange an optical emitter, optical sensor, and ASIC closely together. In such arrangements, however, there may be risk of light pollution or cross-talk, in which some light from the optical emitter, either direct or reflected from some other component of the package, is detected by the adjacent optical sensor before being reflected by an object. Such cross-talk can decrease the performance of the assembly. Accordingly, there is a need for arrangements to minimize space occupied by an optical emitter, optical sensor, and ASIC, while reducing the risk of cross-talk between the emitter and the sensor.

SUMMARY

In one embodiment, an optical sensor module is disclosed. The optical sensor module can include a housing and an optical emitter die disposed in the housing. A top surface of the optical emitter die can face a first side of the housing and can be disposed at a first height above a floor of the housing. The optical emitter die can be configured to emit light towards the first side of the housing. The optical sensor module can also include an optical sensor unit comprising an optical sensor die disposed in the housing adjacent the optical emitter die. A top surface of the optical sensor die can face the first side of the housing and can be disposed at a second height above the floor of the housing, the second height different from the first height. The optical sensor unit can be positioned relative to the optical emitter die such that a portion (e.g., a side edge) of the optical sensor unit shadows at least a portion of an optically sensitive surface of the optical sensor die from at least some emitter light that does not exit the housing.

In another embodiment, an optical sensor module is disclosed. The optical sensor module can include a housing comprising an air cavity and an optical emitter die disposed in the air cavity of the housing. A top surface of the optical emitter die can face a first side of the housing. The optical emitter die can be configured to emit light towards the first side of the housing. The optical sensor module can include an optical sensor unit comprising an optical sensor die disposed in the air cavity of the housing adjacent the optical emitter die. A top surface of the optical sensor die can face the first side of the housing. There may be no septum between the optical sensor die and the optical emitter die that optically separates the optical sensor die and the optical emitter die. The optical sensor unit can be positioned to shadow at least a portion of an optically sensitive surface of the optical sensor die from at least some emitter light that does not exit the housing.

In yet another embodiment, a method of manufacturing an optical sensor module is disclosed. The method can include mounting an optical emitter die to a package substrate, a top surface of the optical emitter die facing away from the package substrate and disposed at a first height above the package substrate. The method can include mounting an optical sensor unit comprising an optical sensor die to the package substrate adjacent the optical emitter die. A top surface of the optical sensor die can face away from the package substrate and can be disposed at a second height above the package substrate, the second height different from the first height. The method can further comprise disposing a housing about the optical emitter die and the optical sensor die, wherein a portion (e.g., a side edge) of the optical sensor unit shadows at least a portion of an optically sensitive surface of the optical sensor die from at least some emitter light that does not exit the housing.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The invention and various embodiments and features may be better understood by reference to the following drawings in which.

DETAILED DESCRIPTION

Figure 1:
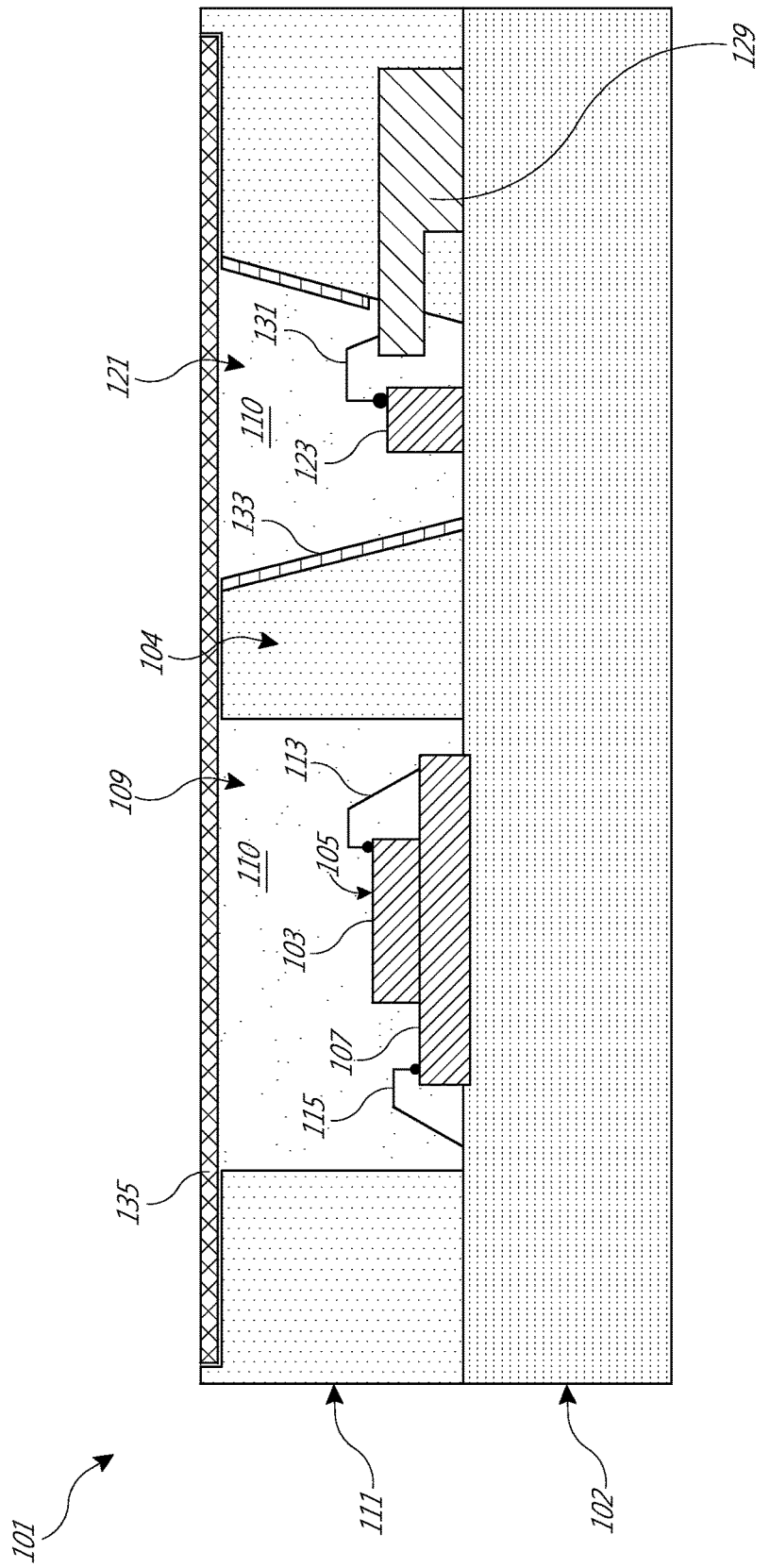
FIG. 1 is a schematic side cross-sectional view of a sensor module with a light-blocking screen between the emitter and optical sensor.

The following detail description of certain embodiments presents various descriptions of specific embodiments of the invention. However, the invention can be embodied in myriad different ways as defined and covered by the claims.

In this description, reference is made to the drawings in which like reference numerals indicate identical or functionally similar elements.

As used herein, directional terms such as "over," "under," "above," "below," "top," "bottom," etc. are intended to indicate relative positioning of the identified components. Such terms are not intended to reference absolute positioning. Accordingly, the entire system can be oriented in any direction, either during manufacturing or in use. The description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature, such as adhesive layers. Thus, although the various schematics shown in the figures depict example arrangements of elements and components, additional intervening elements, devices, features, or components may be present in an actual embodiment. Likewise, "adjacent" means that one element/feature is arranged next to another element/feature, but does not require direct connection or contact between the two.

FIG. 1 is a schematic side cross section of a sensor module 101. The sensor module 101 includes an optical sensor die 103 with an active optical sensor surface 105. The optical sensor die 103 can be formed in a semiconductor material, such as a diced portion of a silicon wafer. The optical sensor surface 105 can be passivated to protect against corrosion. For example, a polyimide layer or a silicon polyimide layer can be provided over the optical sensor surface 105. In some embodiments, the polyimide layer can be applied at the wafer level, prior to singulation of the wafer into a plurality of individual optical sensor dies 103. An application-specific integrated circuit (ASIC) die 107 is disposed beneath the optical sensor die 103. In other arrangements, the ASIC die can be positioned laterally adjacent the optical sensor die, or can be positioned on top of the optical sensor die, with a hole formed through the ASIC to allow light to pass therethrough to reach the optical sensor die. The illustrated stacked arrangement, however, can enhance a height differential between the optical sensor surface 105 and an emitter surface. The ASIC die 107 can be formed in a semiconductor material, such as silicon and can include various embedded passive electronic components (e.g., resistors, capacitors, inductors). In some arrangements, various passive electronic components can be attached to a separate packaging substrate and electrically interconnected to the ASIC die. The ASIC die 107 can range in size from, e.g., about one millimeter across to about five millimeters across. The ASIC die 107 is typically an integrated circuit performing any number of processing functions, depending on the specific application. The ASIC die 107 can include an amplifier, an analog-to-digital converter, and/or a microcontroller processor.

As illustrated, the optical sensor die 103 and ASIC die 107 are disposed in a first cavity 109 of a package body 111. Bond wires 113 provide electrical connection between the optical sensor die 103 and ASIC die 107, while bond wires 115 provide electrical communication between the ASIC die 107 and a package substrate 102, which may comprise a laminate substrate such as a printed circuit board (PCB). In other arrangements, flip-chip connection, through silicon vias and solder bumps or other electrical interconnection methods may be used in lieu of bond wires to electrically connect the dies to the package substrate 102. As shown in FIG. 1, the ASIC die 107 can be mounted onto a top surface of the package substrate 102. Although the package substrate 102 of FIG. 1 is a laminate substrate, in other arrangements the package substrate 102 can comprise a leadframe substrate, a ceramic substrate, or any other suitable type of substrate.

The package body 111 can take the form of a pre-molded body, having cavities defined therein including first cavity 109 and a second cavity 121. The pre-molded package body 111 can be positioned over the package substrate 102. The pre-molded package body 111 includes the first cavity 109 which is configured to receive the stacked ASIC die 107 and optical sensor die 103, and the second cavity 121 which is configured to receive an optical emitter die 123. As shown in the arrangement of FIG. 1, one or more walls 104 can physically and optically separate the first cavity 109 from the second cavity 121 so as to reduce or eliminate optical cross-talk between the optical emitter die 123 and the optical sensor die 103. The walls 104 of the second cavity 121 can be coated with a reflective coating 133, and can be oriented with a slanted surface, creating a funnel or conical shape. The angle of the walls 104, relative to the emitter axis, can vary, for example, between about 1 and 30 degrees. An outer cover 135 can be disposed over the pre-molded body 111. The outer cover 135 can be, for example, glass or other optically transmissive material such as a transparent polymer. The first and second cavities 109 and 121 may be filled with clear optical encapsulant 110 prior to attaching the outer cover 135.

Within the second cavity 121, the optical emitter die 123 can have an emitter surface and can be mounted onto the top surface of the package substrate 102. Optical emitter die 123 can comprise, for example, a light emitting diode (LED). The optical emitter die 123 is shown electrically connected to a bonding shelf 129 that is embedded in the package body 111 via bond wire 131. In other arrangements, the optical emitter die 123 can be electrically connected to the laminate substrate 102 directly, and the bonding shelf 129 may be omitted. In the illustrated arrangement, the second cavity 121 is shaped conically, such that the opening of the second cavity 121 increases with distance from the top surface of the package substrate 102.

In use, light from the optical emitter die 123 is directed out of the optical sensor module 101 through the opening in the second cavity 121. The conical shape and reflective coating 133 can increase both the amount of light exiting the second cavity 121 and the angle of distribution outside the package body 111. The emitted light is reflected from objects at some distance from the optical sensor module 101, for example, by a user's hand for performing a gesture or a medical measurement (such as a heart rate monitor, oxygen sensor, etc.). The reflected light can be detected by the optical sensor die 103 in the first cavity 109. To assist in detection of reflected light, and thereby detection of performed gestures, the optical sensor die 103 and the optical emitter die 123 can be optically isolated from one another, for example, by the wall 104. By placing these two dies in separate cavities 109 and 121, separated by the wall 104 of the package body 111 (e.g., an opaque molding compound or ceramic material), the risk of light pollution or cross-talk directly between the optical sensor die 103 and the optical emitter die 123, without an intervening external object or motion, can be reduced. Other types of optical barriers, walls, or septums may be used to optically separate the two cavities 109, 121.

The cover 135, e.g., glass, may be provided to define an upper or forward surface of the sensor module 101, such that light emitted from the optical emitter die 123 passes through the cover glass, and similarly light reflected from an object passes through the cover glass before reaching the optical sensor die 103. Depending on the position of the cover glass, its thickness, and material composition, there is some risk that light emitted from the optical emitter 123 may reflect off an outer surface of the cover glass and be redirected to the optical sensor die 103 without exiting the cover glass and being reflected off an external object. Such cross-talk can deleteriously affect the performance of the optical sensor module 101. By varying certain design parameters of the package 111, and first and second cavities 109 and 121, the risk of such cross-talk can be reduced. For example, the conical shape of the second cavity 121 and its reflective coating 133 can reduce the risk of cross-talk. Additionally, such cross-talk can be reduced by positioning the optical sensor 103 such that the upper surface 105 is elevated relative to the upper surface 125 of the optical emitter die 123. The difference in height between the sensing surface 105 and the emitting surface 125 may vary in different embodiments.

Elevating the sensor surface 105 can also increase the sensitivity of the optical sensor die 103, independently of the position of the optical emitter die 123. Accordingly, there are advantages both to elevating the optical sensor die 103 and to relatively lowering the optical emitter die 123. The height difference between the sensor surface and the emitter surface may be, e.g., between about 0.1 mm and about 0.9 mm. A wide variety of approaches may be employed for raising the height of the sensor surface 105 with respect to the emitter surface 125. In some embodiments, the ASIC on which the sensor is positioned can be made more or less thick to achieve the desired vertical positioning of the sensor surface. Similarly, the thickness of the sensor die itself and/or the thickness of the emitter die can be controlled to achieve the desired relative heights. The package itself may also be configured to contribute to the desired height differential— for example the first and second cavities can have different depths. In some embodiments, the sensor and/or ASIC can be positioned on another component so as to raise the height of the sensor surface. For example, a heat slug may be provided beneath the ASIC both for its thermal management properties and also to raise the height of the sensor. Various other techniques are possible.

The total height of the module 101 can vary. In some examples, the total height can be between about 1.0 and 1.4 mm. The relative height of the package, relative to the dies, permits recessing the emitter surface by, e.g., between about 0.7 mm and 1.1 mm from the top of the module 101, while the sensor surface can be significantly closer to the top of the module, e.g. between about 0.2 mm and 1.0 mm from the top of the module 101. This differential can aid in minimize or reduce "pollution" or cross-talk from the emitter 123 to the sensor 103.

The lateral distance between the center of the optical emitter die 123 and the center of the optical sensor die 103 can vary to achieve reduced cross-talk. In various examples, this lateral distance can be between about 0.25 mm to about 3 mm.

The design of the package, the relative heights of the emitter surface and the sensor surface, and the lateral spacing between the center of the optical sensor die and the center of the optical emitter die can all contribute to reduced cross-talk between the sensor and the emitter. In some arrangements, the module is configured such that less than about 5% of light emitted from the emitter surface is reflected from the cover glass to the sensor surface. Additional examples of optical sensor modules generally similar to those illustrated in FIG. 1 may be found in U.S. Patent Publication No. US 2014/0340302, the contents of which are incorporated by reference herein in their entirety and for all purposes.

As explained above, in various arrangements, a wall 104 or other type of septum can be used to reduce cross-talk between the optical sensor die 103 and the optical emitter die 123. The wall 104 can comprise an opaque material (with or without a reflective coating) which blocks light from being transmitted directly from the emitter die 123 to the sensor die 103 without passing outside the cavity 121 to the object of interest (e.g., a user's hand or finger). However, the use of a separate wall 104 or other septum may occupy valuable package real estate, increasing the overall size of the sensor module 101. Moreover, the wall 104 or other septum divides the module 101 into two cavities 109, 121, each of which is disposed under a corresponding window. It can be advantageous to prevent or reduce optical cross-talk or optical pollution while also further reducing the size of the sensor module as compared with the arrangement of FIG. 1.

Figure 2A:
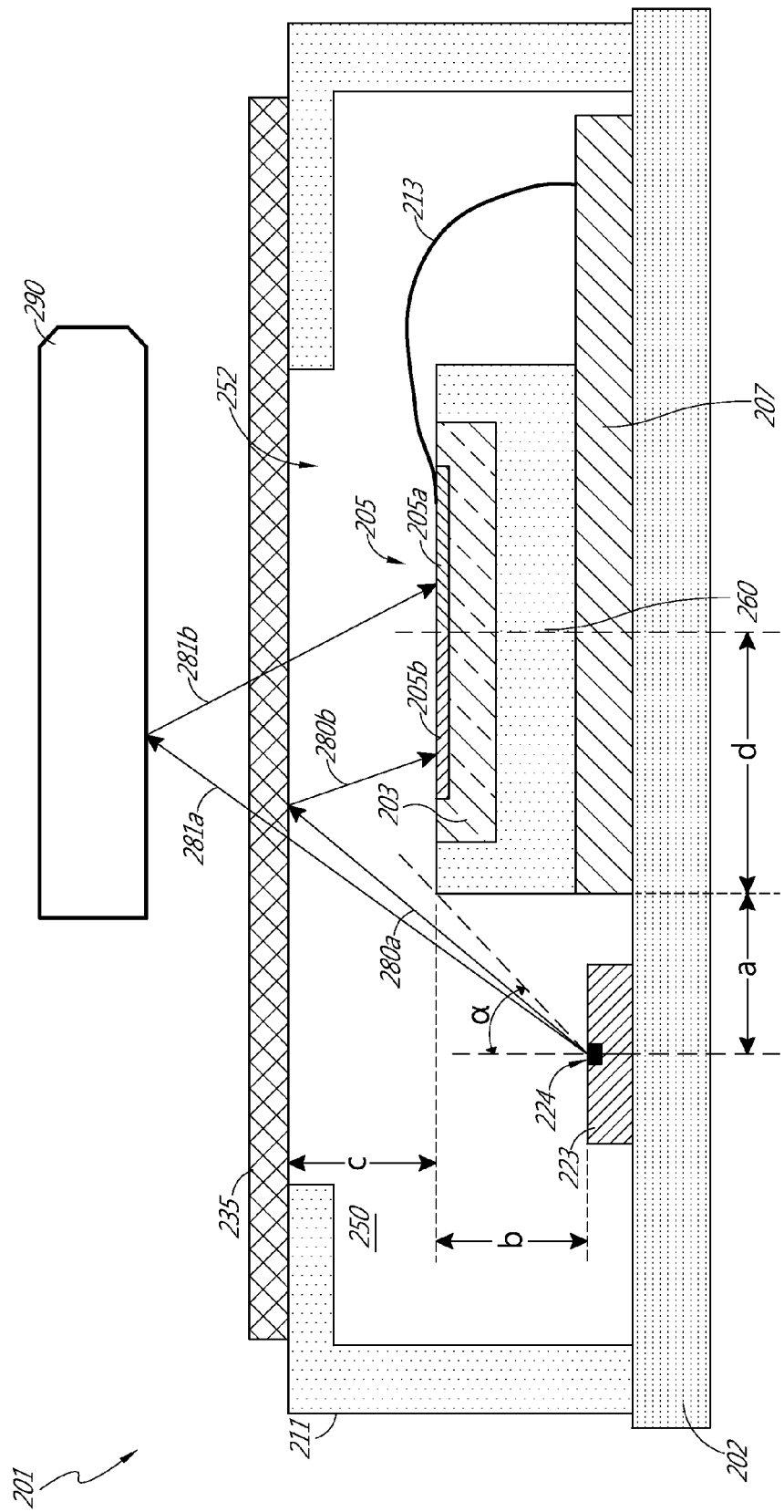
FIG. 2A is a schematic side cross-sectional view of an optical sensor module comprising a cavity, according to one embodiment.

FIG. 2A is a schematic side cross-sectional view of an optical sensor module 201 according to one embodiment. Unless otherwise noted, the reference numerals in FIG. 2A refer to components which are the same as or generally similar to the reference numerals in FIG. 1, except the reference numerals in FIG. 2A are incremented by 100 relative to those of FIG. 1. For example, as with the sensor module 101 of FIG. 1, the sensor module 201 of FIG. 2A can comprise a package substrate 202 and a package housing 211 mounted to the package substrate 202. The package substrate 202 can comprise a laminate substrate (such as a PCB). In other embodiments, the package substrate 202 can comprise any other suitable type of substrate, such as a molded leadframe or ceramic substrate. The housing 211 can comprise any suitable type of enclosure, such as a lid or package body, which defines a cavity 250. For example, the housing 211 can comprise a portion of a pre-molded body similar to the package body 111 of FIG. 1, and the substrate and walls can be molded together in some arrangements. Alternatively, the housing 211 can comprise a package lid comprising metal and/or plastic. In the embodiment of FIG. 2A, the cavity 250 can comprise an air cavity. In other embodiments (see FIG. 4), the housing can comprise a transparent molding material. In still other embodiments, a cavity similar to the cavity 250 of FIG. 2A can be filled with an encapsulating material. An outer cover 235 can be disposed over the housing 211. The outer cover 235 can be, for example, glass or other optically transmissive material such as a transparent polymer. The outer cover 235 can cover a single window 252 or opening through which light passes out of and into the cavity 250. In other arrangements (not shown), a single window can be masked with optically absorbent or opaque material to effectively define separate windows for the emitter and sensor. In still other arrangements (not shown), separate windows in front of the emitter and sensor can be provided in opaque material.

An optical emitter die 223 having an optically emitting surface 224 can be mounted to and electrically connected to the package substrate 202 within the cavity 250 of the housing 211. Although not illustrated in FIG. 2A, the optical emitter die 223 can be wire bonded to the package substrate 202 in some embodiments. In other embodiments, the emitter die can be mounted to the package substrate, e.g., by way of one or more solder balls connected to through silicon vias (TSVs). As with the arrangement of FIG. 1, the optical emitter die 223 can comprise a light emitting diode (LED) or a vertical cavity laser (VCSEL) type of emitter. For example, the emitter die 223 can comprise an LED which emits light in visible wavelengths, infrared (IR) wavelengths, ultraviolet (UV) wavelengths, and/or any other suitable band of wavelengths. In some embodiments, the emitter die 223 can comprise an array or collection of multiple emitters, e.g., an array of LEDs or other light sources.

A processor or Application Specific Integrated Circuit (ASIC) die 207 can be mounted to and electrically connected with the package substrate 202. Although not shown in FIG. 2A, as with the embodiment of FIG. 1, the ASIC die 207 can be wire bonded to the package substrate 202. Alternatively, the ASIC die 207 can be flip-chip mounted to the package substrate 202. An optical sensor unit can be mounted to the ASIC die 207. The optical sensor unit can comprise an optical sensor die 203 and a spacer 260 in some embodiments. In other embodiments, the optical sensor unit can comprise an optical sensor die 203 without a spacer. In the embodiment of FIG. 2A, the optical sensor die 203 can be mounted to the ASIC die 207 by way of the spacer 260 which, among other functions, can serve to elevate the optical sensor die 203 relative to the ASIC die 207 and package substrate 202. In other arrangements, a separate spacer can be provided under the optical sensor die, either above or below an ASIC die, or without an ASIC die. The optical sensor die 203 can comprise an active optical sensor surface 205. In some embodiments, the active optical sensor surface 205 can comprise a first region 205a and a second region 205b. In some embodiments, the first region 205a can be monitored for optical activity and the second region 205b may not be monitored for optical activity, or vice versa. In some embodiments, both the first and second regions 205a, 205b may be monitored for optical activity. The optical sensor die 203 can be formed in a semiconductor material, such as a diced portion of a silicon wafer. The optical sensor surface 205 can be passivated to protect against corrosion. For example, an optically transparent or translucent polyimide layer or a silicon polyimide layer can be provided over the optical sensor surface 205. In some embodiments, the polyimide layer can be applied at the wafer level, prior to singulation of a wafer into the plurality of individual optical sensor dies 203. In various embodiments, the optical sensor surface 205 can comprise one or more photodiodes which convert light to electrical current, although other types of active sensing surfaces may be suitable. The optical sensor die 203 can be electrically connected to the ASIC die 207 by one or more bonding wires 213, although other types of electrical connections (e.g., TSV and solder connections) may be suitable.

The ASIC die 207 can be formed in a semiconductor material, such as silicon and can include various embedded passive electronic components (e.g., resistors, capacitors, inductors). In some embodiments, various passive electronic components can be attached to a separate packaging substrate and electrically interconnected to the ASIC die 207. In various embodiments, the ASIC die 207 can range in size from, e.g., about one millimeter across to about five millimeters across. The ASIC die 207 is typically an integrated circuit performing any number of processing functions, depending on the specific application. For example, in various embodiments the ASIC die 207 can include an amplifier, an analog-to-digital converter, and/or a microcontroller processor. The ASIC die 207 can be configured to process signals detected or transduced by the optical sensor die 203.

The spacer 260 can comprise an optically opaque or absorptive material. For example, in some embodiments, the spacer 260 can comprise a black molding compound. In some embodiments, the optical sensor die itself can act as an absorptive material and the regions 205b and 205a can be separated for measurement. In the embodiment of FIG. 2A, the optical sensor die 203 can be at least partially embedded within the spacer 260 such that the back side and lateral sides of the sensor die 203 are covered by the spacer 260 while the active surface 205 is exposed. At least partially embedding the sensor die 203 within the spacer 260 can advantageously prevent or reduce optical cross-talk or pollution from emitter light which does not exit the housing. Advantageously, the spacer 260 can serve to elevate the sensor die 203 such that a top surface of the emitter die 203 is spaced from a top surface of the emitter die 223 by a relative height b. Moreover, the side edge of the spacer 260 can be laterally spaced from the center of the emitting surface 224 of the emitter die 223 by a lateral spacing a, which may be positive (FIG. 2A). The lateral spacing a and the relative height b (which may depend upon the respective heights of the top surface of the sensor die 203 and the emitter die 223 relative to the substrate 202) can be selected such that the optical sensor die 203 and/or the spacer 260 shadows at least a portion of the optically sensitive surface 205 of the optical sensor die 203 to prevent or reduce optical pollution from emitter light that does not exit the housing 211.

The distances a and b can be selected to reduce or eliminate cross-talk by the shadow effect of the side edge of the optical sensor die 203 (or combination of the optical sensor die 203 and spacer 260, or the side edge of the spacer 260), depending upon factors such as the relative dimensions of the optical emitter 223 and optical sensor die 203; the distance that the active surface 205 is inset from the edge of the optical sensor die 203; and the height, thickness and index of refraction of the window formed by the outer cover 235; etc. Thus, the optical sensor die 203 can be positioned relative to the emitter die 223 such that the edges of the sensor die 203 and/or the spacer 260 (e.g., the sensor unit) intercept direct light rays emitted by the emitter die 223 and such that single (or direct) reflections of light rays from the cover 235 impinge upon inactive surfaces (e.g., outside the active surface 205) of the sensor die 203.

For example, in operation, the sensor module 201 can be used to image portions of an object 290, which may comprise a user's hand or finger in some arrangements. Some emitted light rays 281a can be emitted from the emitter die 223 towards the window 252 and the object 290. These emitted rays 281a can pass through the cavity 250 and outer cover 235, and can be reflected by the object 290. Reflected rays 281b may pass back through the outer cover 235 and into the cavity 250. The reflected rays 281b can impinge upon the first region 205a of the active surface 205 of the optical sensor die 203. The sensor die 203 can transduce the reflected rays 280b into an electrical current which can be processed by the ASIC die 207. Because the rays 281b contain optical data from the object 290 to be imaged, the first region 205a can be monitored by the ASIC die 207.

However, in various packaging arrangements, other light rays emitted by the emitter die 223 may impinge upon the sensor die 203 without exiting the cavity 250 and package housing 211. For example, in other arrangements without careful selection of the dimensions a and b, light rays emitted by the emitting surface 224 of the emitter die 223 may pass directly from the emitter die 223 to the active surface 205 of the sensor die 203 without exiting the cavity 250 and housing 211. Furthermore, some light rays 280a emitted by the emitter die 223 may be reflected by the inner or outer surfaces of the outer cover 235, with or without intervening internal reflections, with the reflected rays 280b directed onto the second region 205b of the active surface 205 of the sensor die 203 without exiting the cavity 250 and housing 211. The light rays which impinge upon the active surface 205 of the sensor die 203 without exiting the housing 211 may comprise optical pollution or cross-talk which reduces the overall performance of the sensor module 201. Careful selection of dimensions a and b may cause the single reflected rays 280b to be directed onto inactive portions of the sensor die 203 or spacer 260, and/or onto the second region 205b of the active surface 205, which may not be monitored for optical activity.

As explained above, the top surface of the emitter die 223 can be disposed at a first height above the package substrate 202, and the sensor die 203 can be disposed at a second height above the package substrate 202. A relative height b can be defined between the respective top surfaces of the emitter die 223 and sensor die 203. The lateral spacing a and the relative height b can be selected such that portions of the optical sensor unit (e.g., the optical sensor die 203 and the spacer 260) shadows at least a portion of the optically sensitive surface 205 of the optical sensor die 203 from at least some emitter light that does not exit the housing 211. Moreover, by embedding the sensor die 203 in the spacer 260, the spacer 260 can absorb any light rays which would otherwise be directed at the edges of the sensor die 203. Advantageously, the emitter die 223 and the sensor die 203 can be disposed within the same cavity 250 and can be disposed underneath a single window 252. As shown in FIG. 2A, there may be no septum or walls that are disposed between the emitter die 223 and sensor die 203 so as to optically separate the two dies 223, 203. Using a single cavity 250 without a septum or wall can advantageously enable the use of a smaller and more compact package as compared with the embodiment of FIG. 1. Moreover, eliminating the septum can reduce manufacturing costs, as less material and/or manufacturing steps may be used for the package housing 211.

Thus, bringing the optical emitter die 223 closer to the ASIC 207 and optical sensor die 204 (e.g., by reducing the lateral distance a and/or increasing the relative height difference b between of the optical emitter surface 224 and the optical sensing surface 205) can adjust the angle $\alpha$. Typically, the object 290—such as a user's hand, glove, or other surface—scatters light in all directions once the light reaches it. Thus, the optical surface 205 can be arranged so that there is a second region 205b which receives unwanted light from reflections 280b from the outer cover 235 (light pollution) and from the object 290, and a first region 205a which receives light primarily from the object 290 of interest. The area of region 205b can be determined by the geometry illustrated in FIG. 2A. For example, a distance d can be determined from the edge of the spacer 260 (or edge of the sensor die 203 in other embodiments) to the boundary between regions 205b and 205a such that the second region 205b receives light from both the outer cover 235 (unwanted light) and the object 290. A height c can also be measured between the optical sensing surface 205 and the bottom of the cover 235. The angle $\alpha$ can be defined as $$\tan(\alpha) = \frac{a}{b},$$

and d can be given by $$d = 2c\tan(\alpha) = 2c\frac{a}{b}.$$

Thus, as shown in these two equations, the size of the second region 205b (related to the distance d) can be based at least in part on the height c, the lateral separation distance a, and the relative height b. In various embodiments, the values of a and b can be selected so as to minimize the extent of the second region 205b for a given package height and choice of materials in which the entire package is embedded. For example, as the height c increases, the angle $\alpha$ can be made smaller, and hence the ratio a/b can be made smaller.

Figure 2B:
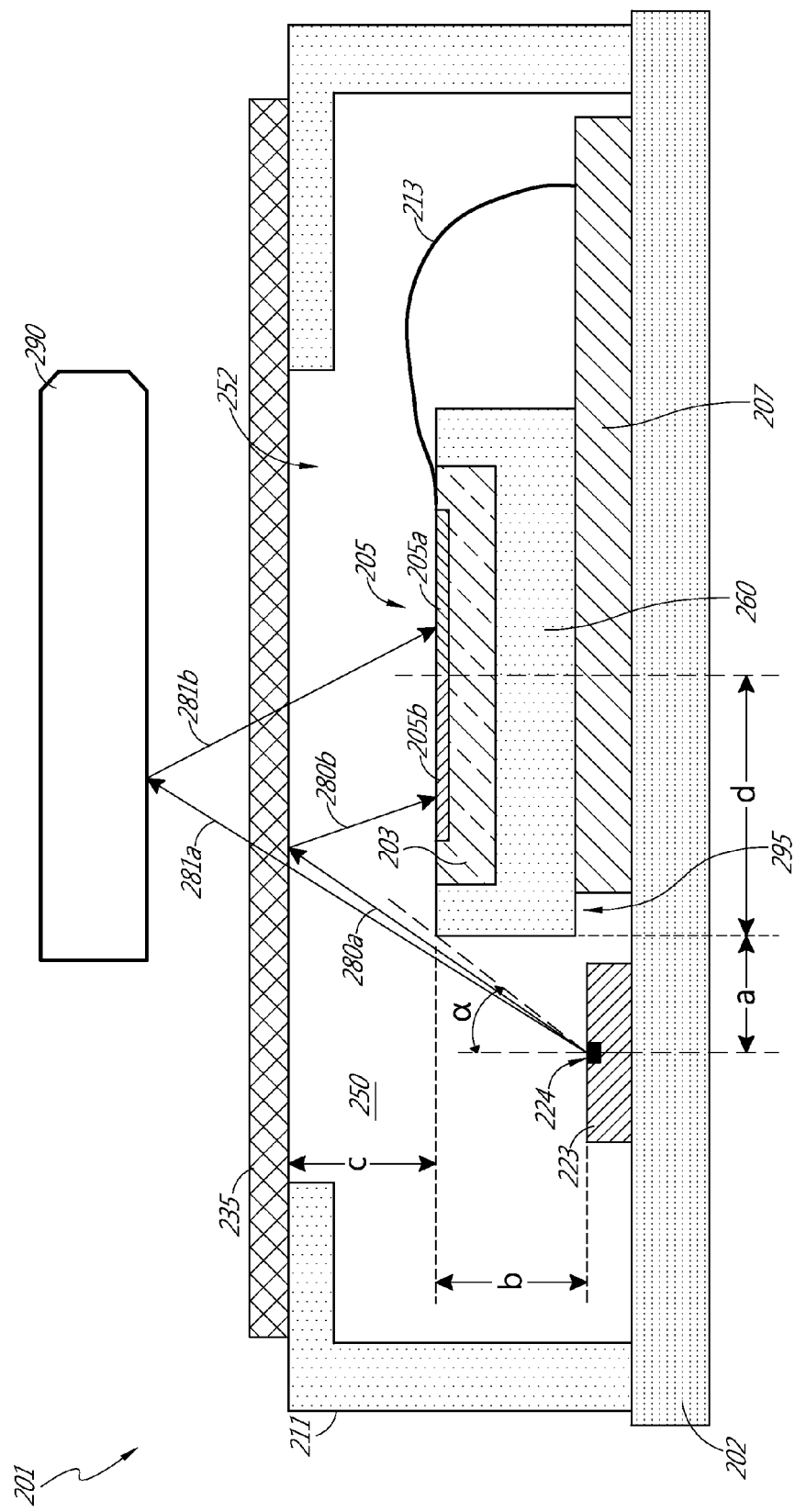
FIG. 2B is a schematic side cross-sectional view of an optical sensor module comprising a cavity, according to another embodiment.

In various embodiments, the lateral spacing a as defined between the edge of the sensor unit, i.e., the edge of the optical sensor die 203 (in embodiments in which the optical sensor die 203 is not embedded in a spacer block) or the edge of the spacer 260 (in embodiments in which the optical sensor die 203 is at least partially embedded in a spacer block), and the center of the emitting surface 224 of the optical emitter die 223 can be in a range of 25 microns to 500 microns, in a range of 50 microns to 300 microns, or more particularly, in a range of 100 microns to 300 microns. In some arrangements, a can be in a range of 50 microns to 200 microns, or in a range of 50 microns to 100 microns. The relative height b between the top surface of the emitter die 223 and the top surface of the sensor die 203 can be in a range of 0 microns to 1000 microns, in a range of 50 microns to 1000 microns, in a range of 100 microns to 800 microns, or more particularly, in a range of 100 microns to 500 microns. In addition, the center of the optical emitting surface 224 of the optical emitter die 223 can form an angle $\alpha$ of less than 45 degrees to the vertical with a near upper corner of the optical sensor unit, e.g., the near upper corner of the optical sensor die 203 (if not embedded) or the near upper corner of the spacer 260 (if embedded as shown in FIGS. 2A and 2B). In some embodiments, the angle $\alpha$ can be less than 30 degrees, or, more particularly, less than 15 degrees. In some embodiments, the lateral spacing a can be negative or zero (see FIG. 2B and discussion below).

FIG. 2B is a schematic side cross-sectional view of an optical sensor module 201 according to one embodiment. Unless otherwise noted, the reference numerals in FIG. 2B refer to components which are the same as or generally similar to the reference numerals in FIG. 1, except the reference numerals in FIG. 2B are incremented by 100 relative to those of FIG. 1. As shown in FIG. 2B, the optical sensor die 203 and/or spacer 260 can overhang the ASIC die 207 in an overhang region 295 adjacent the optical emitter die 223. In such arrangements, the overhang region 295 can serve to position the optical sensor die 203 and/or spacer 260 (if a spacer is used) closer to the optical emitter die 223, which can enhance the shadow effect explained above with respect to the embodiment of FIG. 2A. In FIG. 2B, the lateral spacing a between the center of the emitting surface 224 of the optical emitter die 223 and the nearest edge of the spacer 260 is positive such that the optical sensor die 203 is offset from the optical emitter die 223. In other arrangements (not shown), portions of the spacer 260 and/or the sensor die can align with the near edge of the optical emitter die 223, or can be disposed above and overlap portions of the emitter die 223 (e.g., overlap optically inactive portions of the emitter die 223 and not overlap the emitting surface 224). Furthermore, although a spacer 260 is illustrated in FIG. 2B, it should be appreciated that in other embodiments a spacer may not be used. In arrangements without a spacer, the lateral spacing a can be measured between the center of the optical emitting surface 224 of the optical emitter die 223 and the nearest edge of the optical sensor die 203. The skilled artisan will appreciate that alignment with the edge or even overlap with the optical emitter die 223 does not necessarily block the emitting portion of the optical emitter die, and can still allow angled light rays 281a to exit the module 201 and their reflections 281b sensed the optical sensor die 203.

Figure 3:
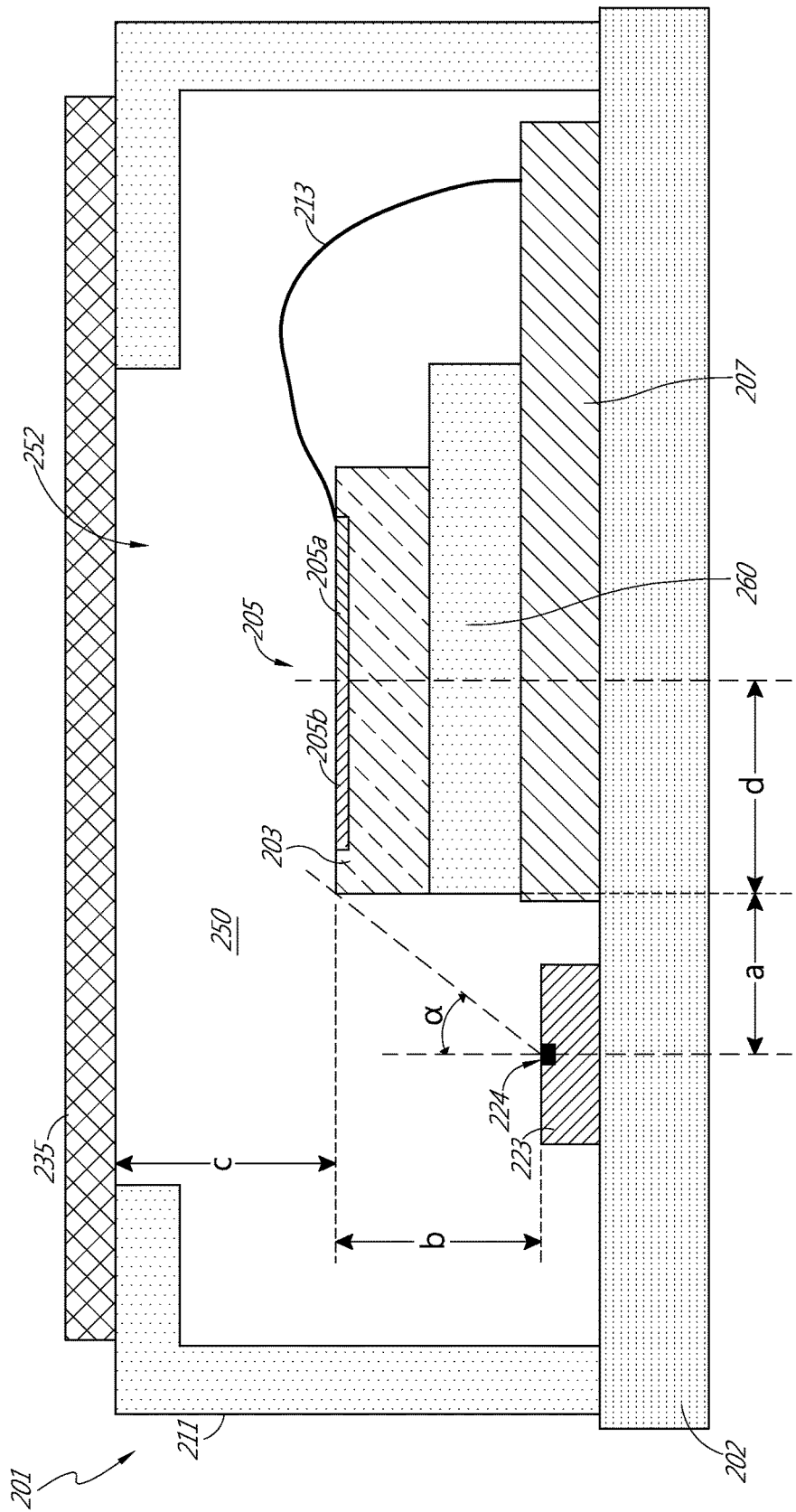
FIG. 3 is a side cross-sectional view of an optical sensor module comprising a cavity, according to another embodiment.

FIG. 3 is a side cross-sectional view of an optical sensor module 201 according to another embodiment. Unless otherwise noted, the reference numerals in FIG. 3 refer to components which are the same as or generally similar to the reference numerals in FIG. 2. However, unlike the embodiment of FIG. 2, the optical sensor die 203 is not embedded in the spacer 260. Rather, the sensor die 203 is mounted on and sits on top of the spacer 260. The spacer 260 can comprise an optically opaque or absorptive material in various embodiments. However, in other embodiments, the spacer 260 may not be opaque; rather, the spacer 260 may sufficiently vertically offset the sensor die 203 relative to the emitter die 223 so as to sufficiently reduce optical cross-talk. The lateral spacing a (as measured between the center of the emitting surface 224 of the emitter die 223 and the nearest edge of the sensor die 203) and the relative height b can be selected such that the optical sensor die 203 shadows at least a portion of the optically sensitive surface 205 of the optical sensor die 203 to prevent or reduce optical pollution from emitter light that does not exit the housing 211. Advantageously, by using a sensor module 201 without a septum such that the dies 203, 223 are disposed within a common cavity 250 under a single window 252, the overall size and footprint of the sensor module 201 can be reduced while preventing or reducing optical pollution or cross-talk. While not shown, it will be understood that, like FIG. 2B, the optical sensor die 203 and/or spacer 260 of FIG. 3 can also overhang the edge of the ASIC 207 closest to the optical emitter die 223, or the optical sensor die 203 can overhang the edge of the spacer 260 closest to the optical emitter die 223, to facilitate the shadow effect.

Figure 4:
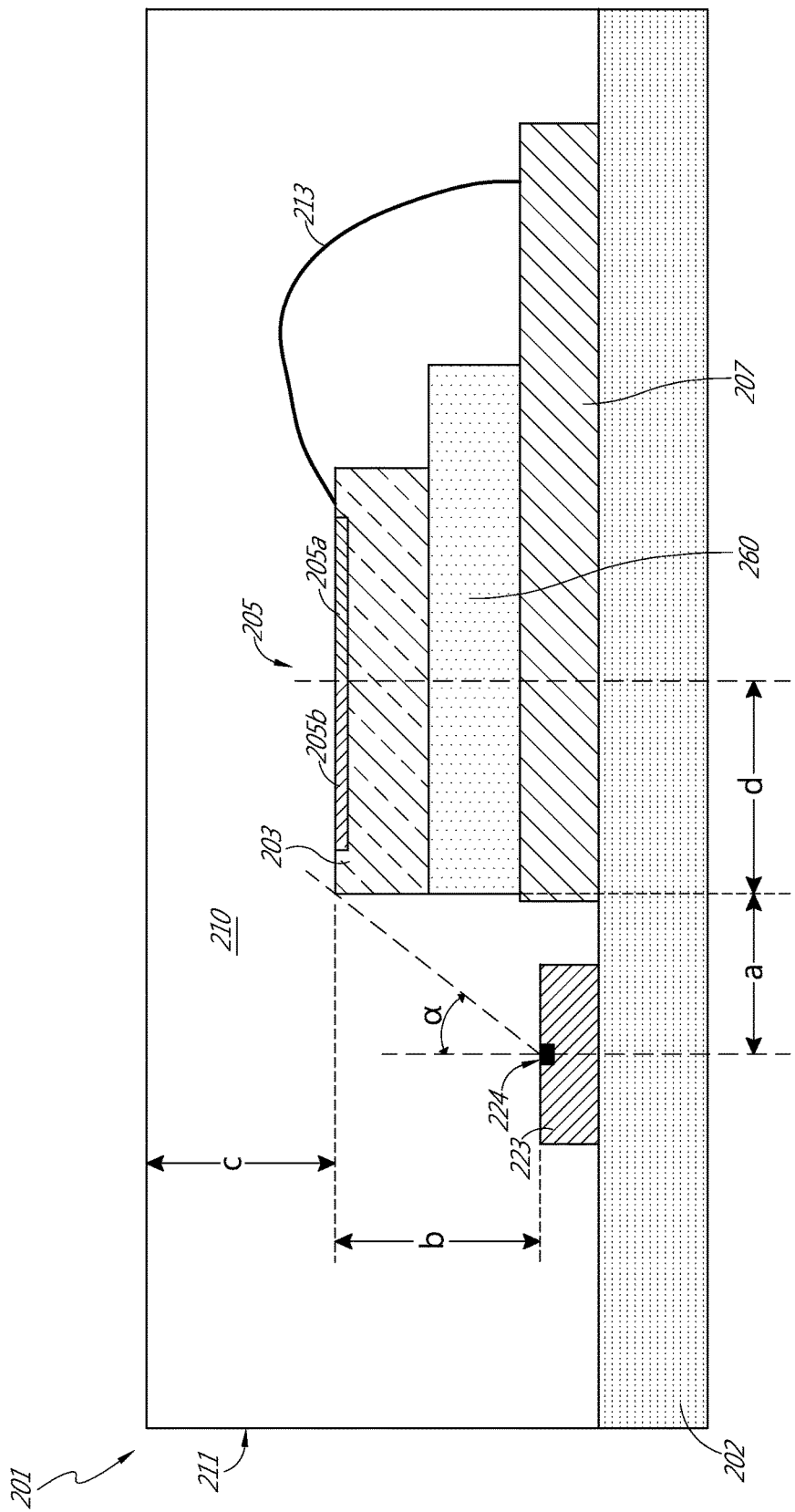
FIG. 4 is a side cross-sectional view of an optical sensor module 201 comprising a molded encapsulant, according to another embodiment.

FIG. 4 is a side cross-sectional view of an optical sensor module 201 according to another embodiment. Unless otherwise noted, the reference numerals in FIG. 4 refer to components which are the same as or generally similar to the reference numerals in FIGS. 2A-3. For example, as with the embodiments of FIGS. 2A-3, the optical emitter die 223 can be mounted to and electrically connected with the package substrate 202. The ASIC die 207 can be mounted to and electrically connected with the package substrate 202. The optical sensor die 203 having active surface 205 can be mounted to the ASIC die 207 by way of the intervening spacer 260. The sensor die 203 can be connected to the ASIC die 207 with bonding wire(s) 213. Furthermore, as with the embodiments of FIGS. 2A-3, the lateral spacing a (as measured between the center of the emitting surface 224 of the emitter die 223 and the nearest edge of the sensor die 203) and the relative height b can be selected such that the optical sensor die 203 shadows at least a portion of the optically sensitive surface 205 of the optical sensor die 203 from at least some emitter light that does not exit the sensor module 201. Advantageously, by using a sensor module 201 without a septum, the overall size and footprint of the sensor module 201 can be reduced while preventing or reducing optical pollution or cross-talk.

However, unlike the sensor modules shown in FIGS. 2A-3, the package housing 211 of FIG. 4 can comprise a transparent encapsulant 210 or molding compound which is applied over the emitter die 223, the sensor die 203, the spacer 260, and the ASIC die 207. Thus, the encapsulant 210 can define the housing, and a separate lid or other pre-molded body need not be used in the embodiment of FIG. 4. Rather, after mounting the dies 223, 203, 223 to the substrate 202, the encapsulant 210 can be overmolded onto the substrate 202 to encapsulate the emitter die 223, sensor die 203, spacer 260, and ASIC die 207. The transparent encapsulant 210 can advantageously protect the dies 203, 207, 223 from particulates or other damaging materials, while allowing the transmission of light out of the housing 211 and onto the object of interest, and back into the housing 211 after reflecting off the object.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An optical sensor module comprising:
   a housing;
   an optical emitter die disposed in the housing, a top surface of the optical emitter die facing a first side of the housing and disposed at a first height above a floor of the housing, the optical emitter die configured to emit light towards the first side of the housing; and
   an optical sensor unit comprising an optical sensor die disposed in the housing adjacent the optical emitter die, a top surface of the optical sensor die facing the first side of the housing and disposed at a second height above the floor of the housing, the second height different from the first height,
   wherein the optical sensor unit is positioned relative to the optical emitter die such that a portion of the optical sensor unit shadows at least a portion of an optically sensitive surface of the optical sensor die from at least some emitter light that does not exit the housing.

2. The sensor module of claim 1, wherein the optical sensor die is spaced from the optical emitter die by a lateral distance, wherein the lateral distance, the first height, and the second height are selected such that the optical sensor die shadows the portion of the optically sensitive surface of the optical sensor die from at least some emitter light that does not exit the housing.

3. The sensor module of claim 1, wherein the optical sensor die is positioned relative to the optical emitter die such that a side edge of the optical sensor die intercepts at least some direct light rays emitted from the optical emitter die.

4. The sensor module of claim 1, wherein the optical sensor die is positioned relative to the optical emitter die such that light rays emitted from the optical emitter die and which undergo a single reflection from the housing impinge on the portion of the optically sensitive surface of the optical sensor die.

5. The sensor module of claim 1, wherein there is no septum between the optical sensor die and the optical emitter die that optically separates the optical sensor die and the optical emitter die.

6. The sensor module of claim 1, further comprising a single transparent window through the housing.

7. The sensor module of claim 6, wherein the housing comprises one or more walls coupled with a substrate, the window coupled to the one or more walls over a cavity in which the dies sit without encapsulant over the dies.

8. The sensor module of claim 1, further comprising a processor die to process signals transduced by the optical sensor die.

9. The sensor module of claim 1, wherein the optical sensor unit comprises a spacer to space the optical sensor die above the floor.

10. The sensor module of claim 1, wherein the optical sensor die is at least partially embedded in a molding compound.

11. The sensor module of claim 1, wherein the housing comprises a substrate and a mold compound disposed about the optical emitter die and the optical sensor die.

12. The sensor module of claim 2, wherein at least one of the lateral distance, the first height, and the second height are selected such that an upper corner of the optical sensor unit nearest the optical emitter die forms an angle of less than 45 degrees to the vertical with a center of the emitting surface of the emitter die.

13. The sensor module of claim 12, wherein at least one of the lateral distance, the first height, and the second height are selected such that the upper corner of the optical sensor unit forms an angle of less than 15 degrees to the vertical with the center of the emitting surface of the emitter die.

14. The sensor module of claim 2, wherein the lateral distance is in a range of 50 microns to 300 microns.

15. The sensor module of claim 1, wherein a relative height between the top surface of the optical emitter die and the top surface of the optical sensor die is in a range of 50 microns to 1000 microns.

16. The sensor module of claim 1, wherein the second height is greater than the first height.

17. An optical sensor module comprising:
a housing comprising an air cavity;
an optical emitter die disposed in the air cavity of the housing, a top surface of the optical emitter die facing a first side of the housing, the optical emitter die configured to emit light towards the first side of the housing; and
an optical sensor unit comprising an optical sensor die disposed in the air cavity of the housing adjacent the optical emitter die, a top surface of the optical sensor die facing the first side of the housing,
wherein there is no septum between the optical sensor die and the optical emitter die that optically separates the optical sensor die and the optical emitter die, the optical sensor unit positioned to shadow at least a portion of an optically sensitive surface of the optical sensor die from at least some emitter light that does not exit the housing.

18. The sensor module of claim 17, further comprising a processor die to process signals transduced by the optical sensor die.

* * * * *